US012581765B2

(12) United States Patent (10) Patent No.: US 12,581,765 B2
Zhang et al. (45) Date of Patent: Mar. 17, 2026

(54) ACTIVE PIXEL IMAGE SENSOR AND DISPLAY DEVICE

(71) Applicants:Beijing BOE Sensor Technology Co., Ltd., Beijing (CN); BOE Technology Group Co., Ltd., Beijing (CN)

(72) Inventors: Jie Zhang, Beijing (CN); Shoujin Cai, Beijing (CN); Jin Cheng, Beijing (CN); Dexi Kong, Beijing (CN); Lin Zhou, Beijing (CN); Ziran Liu, Beijing (CN); Tiansheng Li, Beijing (CN); Yingzi Wang, Beijing (CN); Cheng Li, Beijing (CN)

(73) Assignees: Beijing BOE Sensor Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 125 days.

(21) Appl. No.: 18/577,247

(22) PCT Filed: Aug. 25, 2021

(86) PCT No.: PCT/CN2021/114527
§ 371 (c)(1),
(2) Date: Jan. 6, 2024

(87) PCT Pub. No.: WO2023/023974
PCT Pub. Date: Mar. 2, 2023

(65) Prior Publication Data
US 2024/0321928 A1 Sep. 26, 2024

(51) Int. Cl.
H10F 39/00 (2025.01)
(52) U.S. Cl.
CPC ....... H10F 39/811 (2025.01); H10F 39/8057 (2025.01)

(58) Field of Classification Search
CPC .... H10F 39/811; H10F 39/8057; H10F 39/12; H10F 39/802; G06V 40/13; G06V 40/12;
(Continued)

(56) References Cited

U.S. PATENT DOCUMENTS

2001/0000676 A1* 5/2001 Zhang ................... H04N 1/028
257/E27.111
2010/0320391 A1* 12/2010 Antonuk ............... H10F 39/026
257/E31.124
(Continued)

FOREIGN PATENT DOCUMENTS

CN 102664184 A 9/2012
CN 103367379 A 10/2013
(Continued)

OTHER PUBLICATIONS

PCT/CN2021/114527 international search report dated May 7, 2022.

*Primary Examiner* — Albert H Cutler
(74) *Attorney, Agent, or Firm* — IPro, PLLC

(57) ABSTRACT

Disclosed are an active pixel image sensor and a display device. The active pixel image sensor includes: a base substrate; a photoelectric conversion structure arranged on the base substrate; multiple gate signal lines and multiple data signal lines crossed in an insulating manner, the multiple gate signal lines and the multiple data signal lines being configured to provide electrical signals to the photoelectric conversion structure; and a bias voltage layer, arranged on the photoelectric conversion structure and electrically connected with the photoelectric conversion structure, the bias voltage layer being configured to provide a bias voltage to the photoelectric conversion structure; the bias voltage layer includes at least one first hollow structure; and an orthographic projection of the first hollow structure on the base
(Continued)

substrate and an orthographic projection of at least one of the gate signal lines and the data signal lines on the base substrate overlap each other.

16 Claims, 10 Drawing Sheets

(58) Field of Classification Search
CPC ...... G02F 1/1333; H10K 59/65; H10K 59/40; H04N 2201/0008; H04N 25/00; H04N 25/70; H04N 25/779; H04N 25/776
See application file for complete search history.

(56) References Cited

U.S. PATENT DOCUMENTS

| | | | |
|---|---|---|---|
| 2013/0140568 A1 | 6/2013 | Miyamoto et al. | |
| 2013/0264485 A1 | 10/2013 | Kawanabe et al. | |
| 2018/0341031 A1* | 11/2018 | Tredwell | H10F 39/803 |
| 2018/0349664 A1 | 12/2018 | Lin et al. | |
| 2019/0165008 A1* | 5/2019 | Lee | H10F 30/2235 |
| 2019/0229143 A1* | 7/2019 | Wright | H10D 89/911 |
| 2021/0135020 A1 | 5/2021 | Zhao et al. | |

FOREIGN PATENT DOCUMENTS

| | | | |
|---|---|---|---|
| CN | 107958185 A | 4/2018 | |
| CN | 108171192 A | 6/2018 | |
| CN | 108389643 A | 8/2018 | |
| CN | 108960105 A | 12/2018 | |
| CN | 110287920 A | 9/2019 | |
| CN | 110783355 A | 2/2020 | |
| JP | 2013118220 A | 6/2013 | |
| WO | WO-2013044783 A1 * | 4/2013 | H10D 86/021 |

* cited by examiner

VDD  D

33/331

3

ACTIVE PIXEL IMAGE SENSOR AND DISPLAY DEVICE

CROSS-REFERENCE OF RELATED APPLICATIONS

The present disclosure is a National Stage of International Application No. PCT/CN2021/114527, filed Aug. 25, 2021.

TECHNICAL FIELD

The present disclosure relates to the technical field of display, in particular to an active pixel image sensor and a display device.

BACKGROUND

The active pixel sensor (APS) technology, a type of pixel design scheme, can improve the image quality and reduce noise interference. The thin film transistor (TFT) technology has matured over time. A combination of the TFT and APS is probably the future of large-size image sensors.

SUMMARY

Embodiments of the present disclosure provide an active pixel image sensor. The active pixel image sensor includes:
a base substrate;
a photoelectric conversion structure arranged on the base substrate;
a plurality of gate signal lines and a plurality of data signal lines that are crossed in an insulated manner, where the plurality of gate signal lines and the plurality of data signal lines are configured to provide an electrical signal for the photoelectric conversion structure; and
a bias voltage layer, where the bias voltage layer is arranged on the photoelectric conversion structure and electrically connected with the photoelectric conversion structure, and the bias voltage layer is configured to provide a bias voltage for the photoelectric conversion structure; where
the bias voltage layer comprises at least one first hollowed structure, and an orthographic projection of the first hollowed structure on the base substrate overlaps an orthographic projection of at least one of the gate signal line and the data signal line on the base substrate.

In the active pixel image sensor according to the embodiments of the present disclosure, the orthographic projection of the first hollowed structure on the base substrate does not overlap with an orthographic projection of an intersection position between the gate signal line and the data signal line on the base substrate.

In the active pixel image sensor according to the embodiments of the present disclosure, the first hollowed structure includes a first hollowed sub-structure and a second hollowed sub-structure, an orthographic projection of the first hollowed sub-structure on the base substrate overlaps an orthographic projection of the gate signal line on the base substrate, and an orthographic projection of the second hollowed sub-structure on the base substrate overlaps an orthographic projection of the data signal line on the base substrate.

In the active pixel image sensor according to the embodiments of the present disclosure, the base substrate includes a detection area, and the plurality of gate signal lines and the plurality of data signal lines define a plurality of detection units in the detection area; and one photoelectric conversion structure is arranged in each of the plurality of detection units, and two first hollowed sub-structures and two second hollowed sub-structures are arranged around one photoelectric conversion structure.

In the active pixel image sensor according to the embodiments of the present disclosure, a width of the orthographic projection of the first hollowed sub-structure on the base substrate is greater than a width of the orthographic projection of the gate signal line on the base substrate; and
a width of the orthographic projection of the second hollowed sub-structure on the base substrate is greater than a width of the orthographic projection of the data signal line on the base substrate.

The active pixel image sensor according to the embodiments of the present disclosure further includes a power signal line that is arranged on a same layer as the data signal line and is adjacent to the data signal line, where an orthographic projection of the power signal line on the base substrate is located between the orthographic projection of the data signal line on the base substrate and an orthographic projection of the photoelectric conversion structure on the base substrate;
the orthographic projection of the first hollowed sub-structure on the base substrate further covers the orthographic projection of the power signal line on the base substrate; and
the orthographic projection of the second hollowed sub-structure on the base substrate further covers the orthographic projection of the power signal line on the base substrate.

In the active pixel image sensor according to the embodiments of the present disclosure, the bias voltage layer further includes at least one second hollowed structure;
an orthographic projection of the second hollowed structure on the base substrate overlaps an orthographic projection of the photoelectric conversion structure on the base substrate;
the second hollowed structure and the first hollowed structure are arranged independently; and
the orthographic projection of the second hollowed structure on the base substrate is smaller than the orthographic projection of the photoelectric conversion structure on the base substrate.

In the active pixel image sensor according to the embodiments of the present disclosure, a center of the orthographic projection of the second hollowed structure on the base substrate coincides with a center of the orthographic projection of the photoelectric conversion structure on the base substrate.

In the active pixel image sensor according to the embodiments of the present disclosure, the base substrate includes a detection area and a non-detection area around the detection area; and
the bias voltage layer further includes at least one third hollowed structure, the third hollowed structure is located in the non-detection area, and an orthographic projection of the third hollowed structure on the base substrate overlaps a portion of at least one of the gate signal line and the data signal line extending into the non-detection area.

In the active pixel image sensor according to the embodiments of the present disclosure, the third hollowed structure includes a third hollowed sub-structure and a fourth hollowed sub-structure;

an orthographic projection of the third hollowed substructure on the base substrate overlaps a portion of the gate signal line extending into the non-detection area; and an orthographic projection of the fourth hollowed substructure on the base substrate overlaps a portion of the data signal line extending into the non-detection area.

In the active pixel image sensor according to the embodiments of the present disclosure, a plurality of third hollowed sub-structures are uniformly arranged in an extension direction of the gate signal line and overlap one of the plurality of gate signal lines; and a plurality of fourth hollowed sub-structures are uniformly arranged in an extension direction of the data signal line and overlap one of the plurality of data signal lines.

The active pixel image sensor according to the embodiment of the present disclosure further includes a first shield layer on a side of the bias voltage layer facing away from the base substrate; where the first shield layer is electrically connected with a first ground signal terminal, and a shape of the first shield layer is substantially same as a shape of the bias voltage layer.

The active pixel image sensor according to the embodiments of the present disclosure further includes: a first shield layer on a side of the bias voltage layer facing away from the base substrate;

where the first shield layer is electrically connected with a first ground signal terminal;

the first shield layer is a grid structure, a grid hole of the grid structure corresponds to the photoelectric conversion structure; and an area of an orthographic projection of the grid hole of the grid structure on the base substrate is greater than or equal to an area of an orthographic projection of the photoelectric conversion structure on the base substrate.

In the active pixel image sensor according to the embodiments of the present disclosure, orthographic projections of the plurality of gate signal lines and the plurality of data signal lines on the base substrate fall within a range of orthographic projections of grid lines defining grid holes on the base substrate.

Embodiments of the present disclosure further provide a display device. The display device includes the active pixel image sensor as described in any one of the above embodiments of the present disclosure.

The display device according to the embodiments of the present disclosure further includes a second shield layer arranged around the active pixel image sensor, where the second shield layer is electrically connected with a second ground signal terminal.

BRIEF DESCRIPTION OF FIGURES

To describe technical solutions of embodiments of the present disclosure more clearly, accompanying drawings required for description of the embodiments will be briefly described below. Apparently, the accompanying drawings in the following description are merely some embodiments of the present disclosure, and a person of ordinary skill in the art can derive other accompanying drawings from these accompanying drawings without creative efforts.

DETAILED DESCRIPTION

Figure 1:
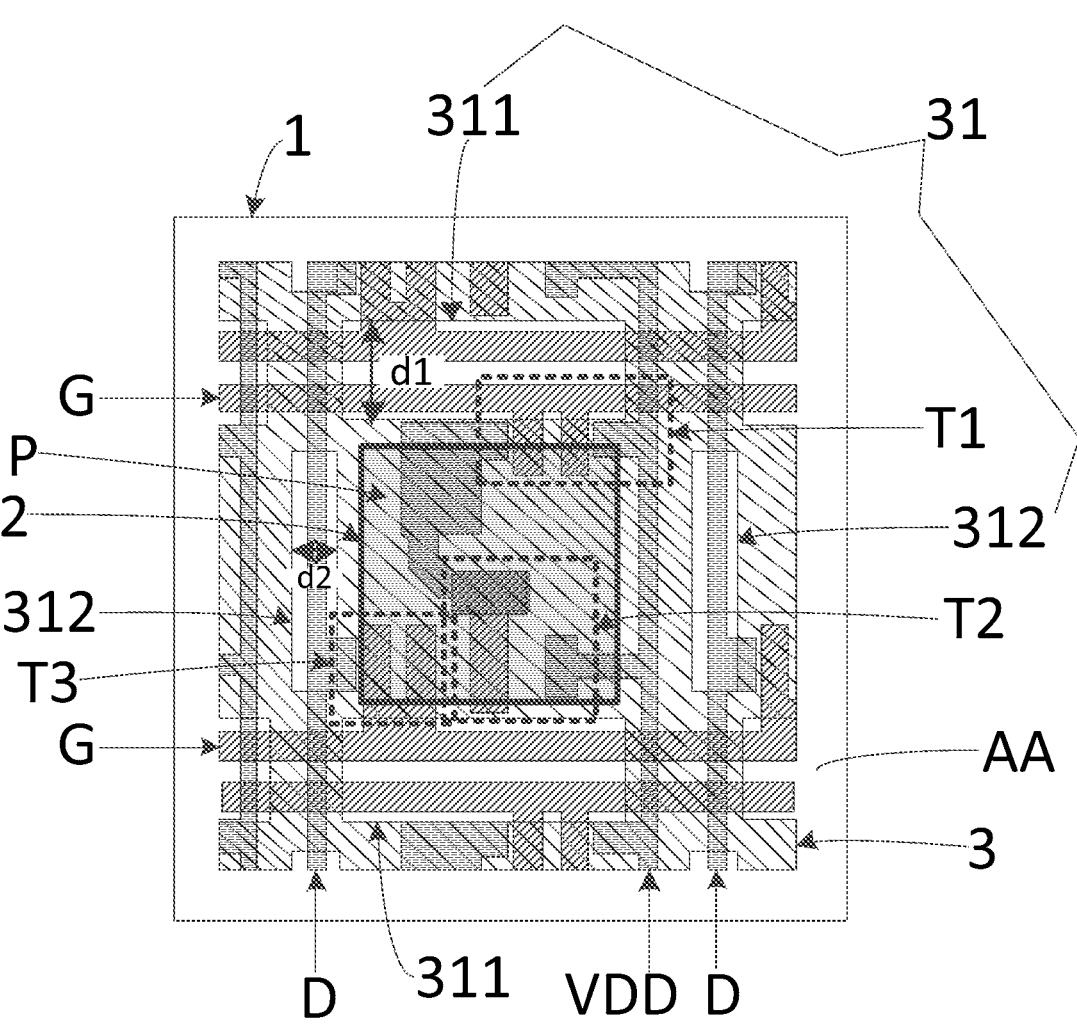
FIGS. 1 to 4 are schematic structural diagrams of several active pixel image sensors according to embodiments of the present disclosure.

In order to make objectives, technical solutions and advantages of embodiments of the present disclosure clearer, the technical solutions of the embodiments of the present disclosure will be clearly and completely described with reference to accompanying drawings of the embodiments of the present disclosure. Apparently, the described embodiments are some embodiments rather than all embodiments of the present disclosure. In addition, the embodiments in the present disclosure and features in the embodiments can be combined mutually if there is no conflict. All the other embodiments derived by a person of ordinary skill in the art from the described embodiments of the present disclosure without creative efforts shall fall within the protection scope of the present disclosure.

Unless otherwise defined, technical terms or scientific terms used in the present disclosure should have ordinary meanings understandable by a person of ordinary skill in the field to which the present disclosure belongs. Words such as "first" and "second" used in the present disclosure do not denote any order, quantity, or importance, but are merely used to distinguish between different components. Words such as "comprise", "include" or "encompass" denote that an element or item in front of the word includes elements or items that are present behind the word and their equivalents, but does not exclude other elements or items. Words such as "connection" and "connected" are not limited to physical or mechanical connections, but can include an electrical connection that is direct or indirect.

It should be noted that a size and a shape of each figure in the accompanying drawings do not reflect true scales, and are merely intended to illustrate contents of the present disclosure. Identical or similar reference numerals denote identical or similar elements or elements having identical or similar functions throughout.

At present, an active pixel sensor structurally includes generally: a base substrate, a drive circuit on the base substrate, a PIN device on the drive circuit, and a planar bias voltage layer on the PIN device. The bias voltage layer is configured to provide a reference voltage (Vbias) signal for the PIN device. Gate signals and data signals in the active pixel sensor are square wave signals, and a high-low level jump of the gate signals and data signals is likely to cause noise of the Vbias signal, which affects stability of the Vbias signal. The active pixel sensor may be applied to fingerprint identification. A fingerprint identification sensor basically needs GND signals on an entire surface to shield static electricity caused by a finger touch, and the static electricity will cause electrostatic breakdown of the devices and cause irreversible damage to the devices. As a result, the active pixel sensor further includes a planar shield layer above the bias voltage layer at present, and the shield layer receives the GND signal. For the two important signals of Vbias and GND, how to give stable and reliable signals becomes an important topic for the active pixel sensor.

In view of this, embodiments of the present disclosure provide an active pixel image sensor. As shown in FIG. 1, FIG. 1 shows a layout structure of the active pixel image sensor, and the active pixel image sensor includes:

a base substrate 1;

a photoelectric conversion structure 2 arranged on the base substrate 1;

a plurality of gate signal lines G and a plurality of data signal lines D that are crossed in an insulated manner, where the plurality of gate signal lines G and the plurality of data signal lines D are configured to provide an electrical signal for the photoelectric conversion structure 2; and a bias voltage layer 3, where the bias voltage layer is arranged on the photoelectric conversion structure 2 and electrically connected with the photoelectric conversion structure 2, and the bias voltage layer 3 is configured to provide a bias voltage (that is, a reference voltage) for the photoelectric conversion structure 2; where the bias voltage layer 3 includes at least one first hollowed structure 31, and an orthographic projection of the first hollowed structure 31 on the base substrate 1 overlaps an orthographic projection of at least one of the gate signal line G and the data signal line D on the base substrate 1.

In the active pixel image sensor according to the embodiment of the present disclosure, the bias voltage layer 3 is provided with at least one first hollowed structure 31, and the orthographic projection of the first hollowed structure 31 on the base substrate 1 overlaps the orthographic projection of at least one of the gate signal line G and the data signal line D on the base substrate 1. In this way, an overlapping area between the bias voltage layer 3 and the gate signal line G and/or the data signal line D can be reduced, and coupling of high and low level signals on the gate signal line G and/or the data signal line D to the reference voltage signal on the bias voltage layer 3 can be reduced. As a result, noise of the Vbias signal on the bias voltage layer 3 caused by the high and low level jump of the signal can be further reduced, and the stability of the Vbias signal on the bias voltage layer 3 can be further be improved.

In some embodiments, in the active pixel image sensor of the present disclosure, as shown in FIG. 1, the gate signal line G and the data signal line D are arranged between the base substrate 1 and the photoelectric conversion structure 2, and are electrically connected with a drive circuit that drives the photoelectric conversion structure 2 to work. The drive circuit may include a reset transistor T1, a drive transistor T2, and a readout transistor T3. The photoelectric conversion structure 2 and the drive circuit structure in the embodiments of the present disclosure are the same as those in the prior art, and will not be described in detail herein.

In some embodiments, since the bias voltage layer is configured to provide a bias voltage (that is, the reference voltage) for the photoelectric conversion structure, the bias voltage layer needs to be arranged in an integral structure. As a result, in the active pixel image sensor according to the embodiments of the present disclosure, as shown in FIG. 1, the orthographic projection of the first hollowed structure 31 on the base substrate does not overlap with an orthographic projection of an intersection position between the gate signal line G and the data signal line D on the base substrate, which is equivalent to digging holes in the original planar bias voltage layer 3. In addition, the holes are provided independently. Therefore, an overlapping area of the bias voltage layer 3 and the gate signal line G and/or the data signal line D is reduced. It is certain that a position of the first hollowed structures 31 is not limited to a structure shown in FIG. 1, which falls within the protection scope of the embodiments of the present disclosure as long as the first hollowed structures 31 overlap the gate signal line G and/or the data signal line D and are independently arranged.

In some embodiments, in order to reduce an overlapping area between the bias voltage layer and a signal line having a square wave signal as much as possible, in the active pixel image sensor of the present disclosure as shown in FIG. 1, the first hollowed structure 31 includes a first hollowed sub-structure 311 and a second hollowed sub-structure 312, an orthographic projection of the first hollowed sub-structure 311 on the base substrate overlaps an orthographic projection of the gate signal line G on the base substrate, and an orthographic projection of the second hollowed sub-structure 312 on the base substrate overlaps an orthographic projection of the data signal line D on the base substrate. In this way, by arranging on the bias voltage layer 3 a hollowed structure that overlaps the gate signal line G and the data signal line D, the coupling of high and low level signals on the gate signal line G and the data signal line D to the reference voltage signal on the bias voltage layer 3 can be further reduced, and the noise on the bias voltage layer 3 can be further reduced.

In some embodiments, in the active pixel image sensor of the present disclosure as shown in FIG. 1, the base substrate 1 includes a detection area AA, and the plurality of gate signal lines G and the plurality of data signal lines D define a plurality of detection units P in the detection area AA (merely one detection unit P is shown in FIG. 1); one photoelectric conversion structure 2 is arranged in each of the plurality of detection units P, and two first hollowed sub-structures 311 and two second hollowed sub-structures 312 are arranged around one photoelectric conversion structure 2. In this way, two first hollowed sub-structures 311 and two second hollowed sub-structures 312 may be correspondingly arranged around each detection unit P, such that the entire bias voltage layer 3 is uniformly provided with hollowed structures, and the overlapping areas between the bias voltage layer 3 and the gate signal line G and between the bias voltage layer and the data signal line D are reduced to the maximum extent.

In some embodiments, in the active pixel image sensor of the present disclosure as shown in FIG. 1, a width d1 of the orthographic projection of the first hollowed sub-structure 311 on the base substrate 1 is greater than a width of an orthographic projection of the gate signal line G on the base substrate 1. In the embodiment of the present disclosure, two gate signal lines G are arranged between two adjacent rows of detection units P, and are electrically connected with different transistors of the two adjacent rows of detection units P respectively. As a result, in some embodiments of the disclosure, a width d1 of the orthographic projection of the first hollowed sub-structure 311 on the base substrate 1 is greater than a width of orthographic projections of two adjacent gate signal lines G on the base substrate 1; and a width d2 of the orthographic projection of the second hollowed sub-structure 312 on the base substrate 1 is greater than a width of an orthographic projection of the data signal line D on the base substrate 1.

Figure 2:
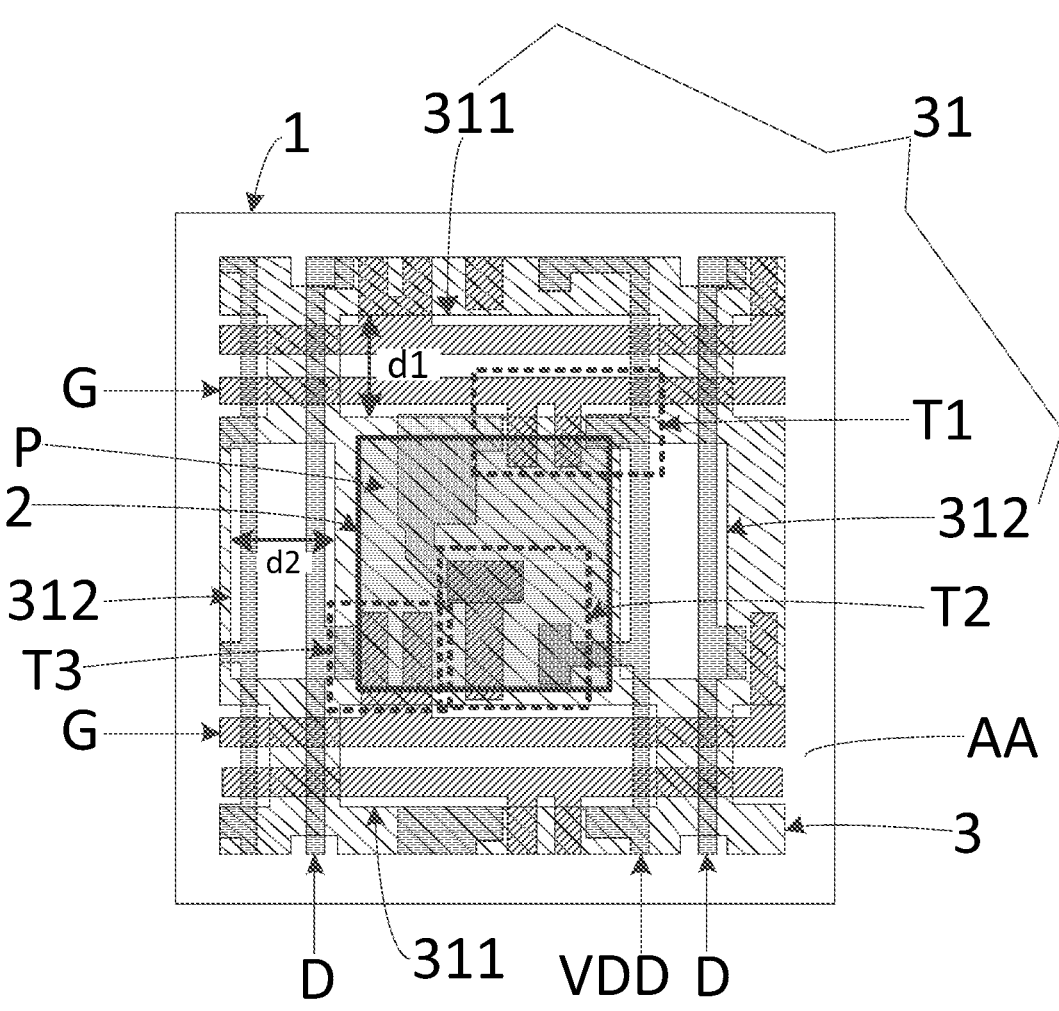

In some embodiments, the active pixel image sensor of the present disclosure further includes a power signal line VDD that is arranged on the same layer as the data signal line and is adjacent to the data signal line D as shown in FIG. 2, where an orthographic projection of the power signal line VDD on the base substrate 1 is located between an orthographic projection of the data signal line D on the base substrate 1 and an orthographic projection of the photoelectric conversion structure 2 on the base substrate 1.

The orthographic projection of the first hollowed substructure 311 on the base substrate further covers the orthographic projection of the power signal line VDD on the base substrate 1. In this way, an overlapping area of the bias voltage layer 3 and the power signal line VDD can be reduced, signal coupling between the bias voltage layer 3 and the power signal line VDD can be reduced, and stability of a bias voltage signal on the bias voltage layer 3 and stability of a power signal on the power signal line VDD can be improved.

The orthographic projection of the second hollowed substructure 312 on the base substrate 1 further covers the orthographic projection of the power signal line VDD on the base substrate 1. In this way, the overlapping area of the bias voltage layer 3 and the power signal line VDD can be further reduced, signal coupling between the bias voltage layer 3 and the power signal line VDD can be further reduced, and the stability of the bias voltage signal on the bias voltage layer 3 and the stability of the power signal on the power signal line VDD can be further improved.

Figure 3:
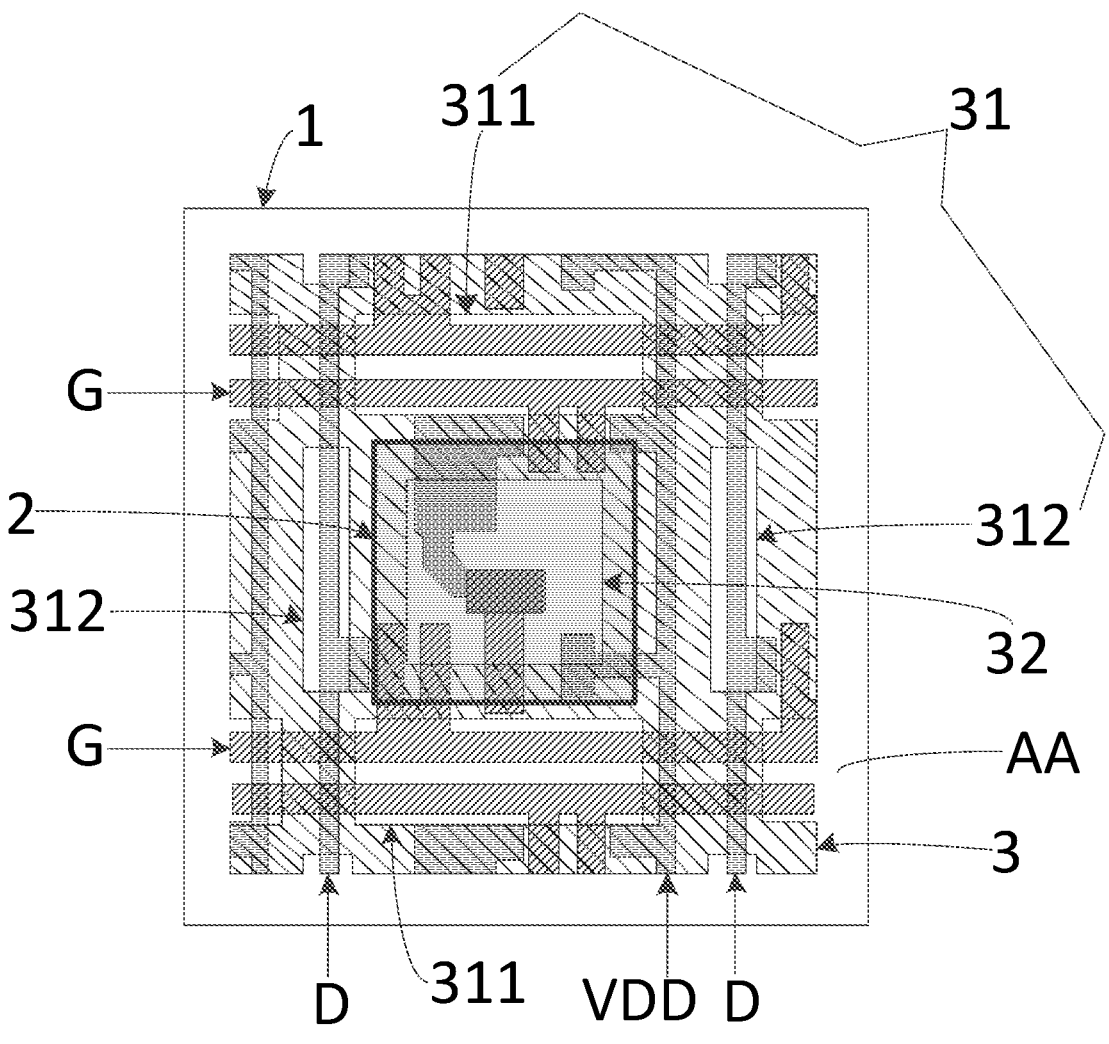
Figure 4:
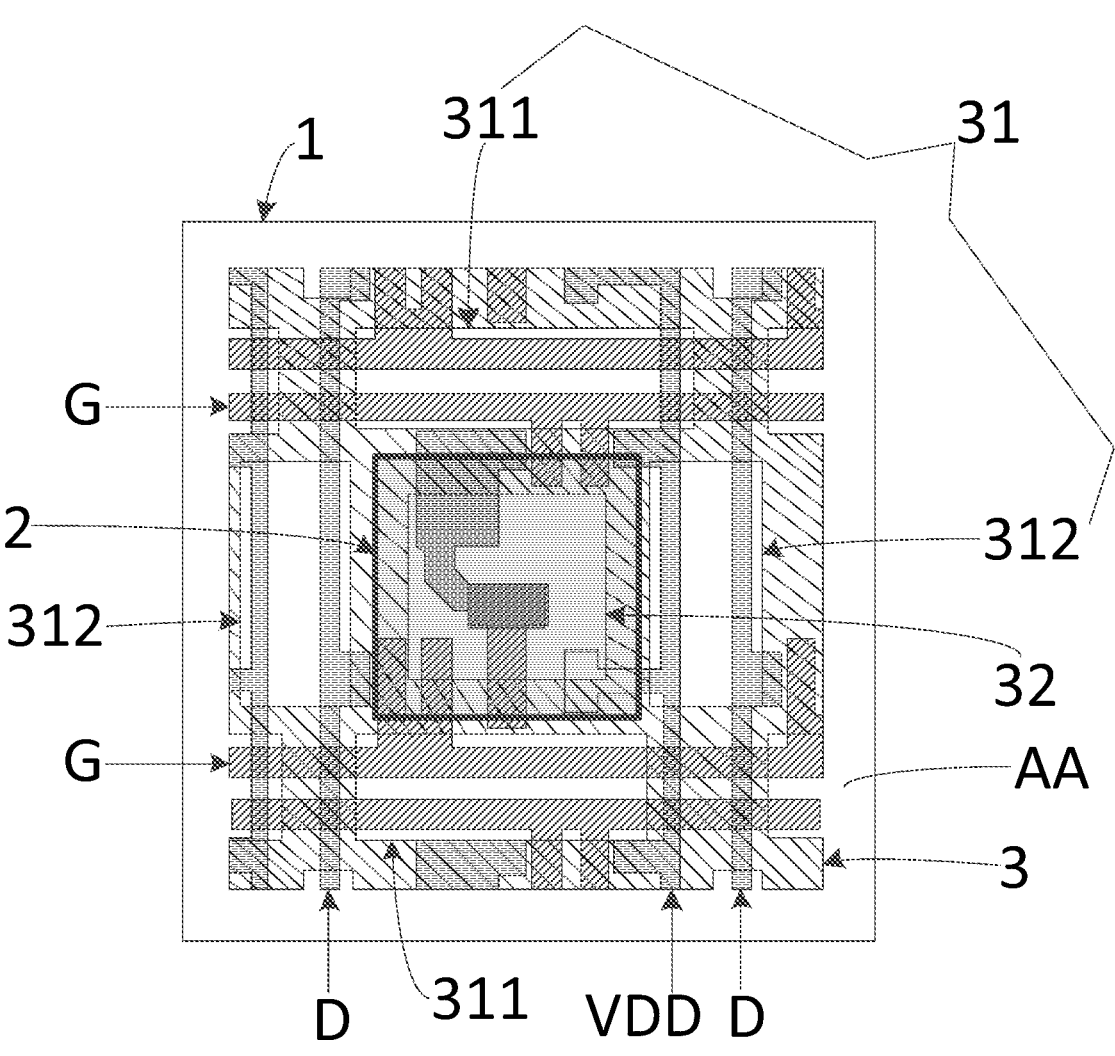

In some embodiments, in the active pixel image sensor of the present disclosure as shown in FIGS. 3 and 4, the bias voltage layer 3 further includes at least one second hollowed structure 32, an orthographic projection of the second hollowed structure 32 on the base substrate 1 overlaps the orthographic projection of the photoelectric conversion structure 2 on the base substrate 1, the second hollowed structure 32 and the first hollowed structure 31 are arranged independently, and the orthographic projection of the second hollowed structure 32 on the base substrate 1 is smaller than the orthographic projection of the photoelectric conversion structure 2 on the base substrate 1. In some embodiments, the photoelectric conversion structure 2 generally includes a first electrode electrically connected with the drive circuit, a second electrode electrically connected with the bias voltage layer 3, and a PIN structure located between the first electrode and the second electrode. Since the second electrode, the PIN structure and the first electrode can be regarded as a sandwich structure, orthographic projections of the three components have substantially the same area. In the embodiment of the present disclosure, an area of the second hollowed structure 32 is smaller than an area of the photoelectric conversion structure 2, that is, the area of the second hollowed structure 32 is smaller than an area of the second electrode. In this way, on the basis of guaranteeing an electrical connection between the bias voltage layer 3 and the second electrode, an overlapping area of the bias voltage layer 3 and the second electrode can be reduced, signal coupling between the bias voltage layer 3 and the second electrode can be reduced, and stability of the second electrode of a signal on the second electrode can be improved.

In some embodiments, in the active pixel image sensor of the present disclosure as shown in FIGS. 3 and 4, a center of the orthographic projection of the second hollowed structure 32 on the base substrate 1 may coincide with a center of the orthographic projection of the photoelectric conversion structure 2 on the base substrate 1. In this way, the second hollowed structures 32 are uniformly arranged, such that uniformity of the bias voltage signal can be improved. It is certain that the center of the orthographic projection of the second hollowed structure 32 on the base substrate 1 may not coincide with the center of the orthographic projection of the photoelectric conversion structure 2 on the base substrate 1.

Figure 5:
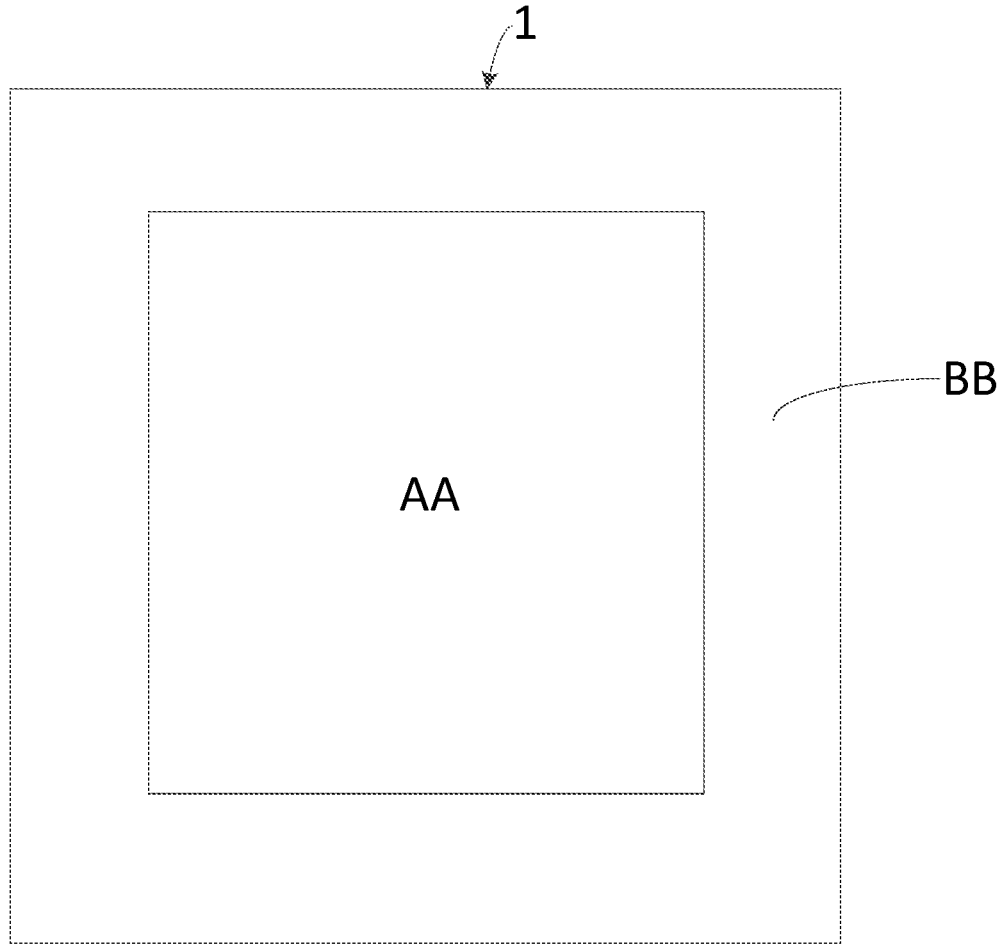
FIG. 5 is a schematic structural diagram of a plan view of an active pixel image sensor according to an embodiment of the present disclosure.

In some embodiments, in the active pixel image sensor of the present disclosure as shown in FIG. 5, the base substrate 1 includes the detection area and a non-detection area BB around the detection area AA. Structures in FIGS. 1-4 are shown in a schematic structural diagram of one detection unit in the detection area AA in FIG. 5.

Figure 6:
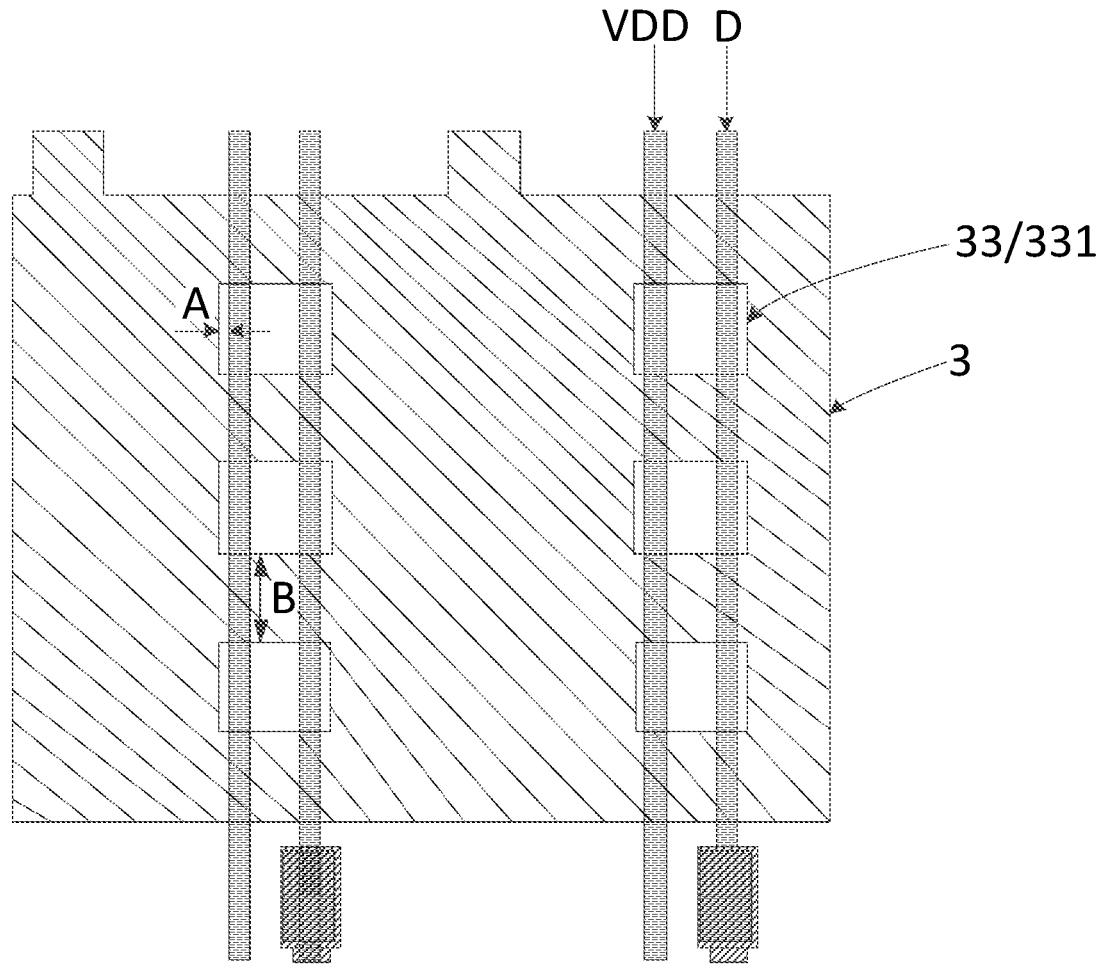
FIGS. 6 to 9 are schematic structural diagrams of several another active pixel image sensors according to embodiments of the present disclosure.
Figure 7:
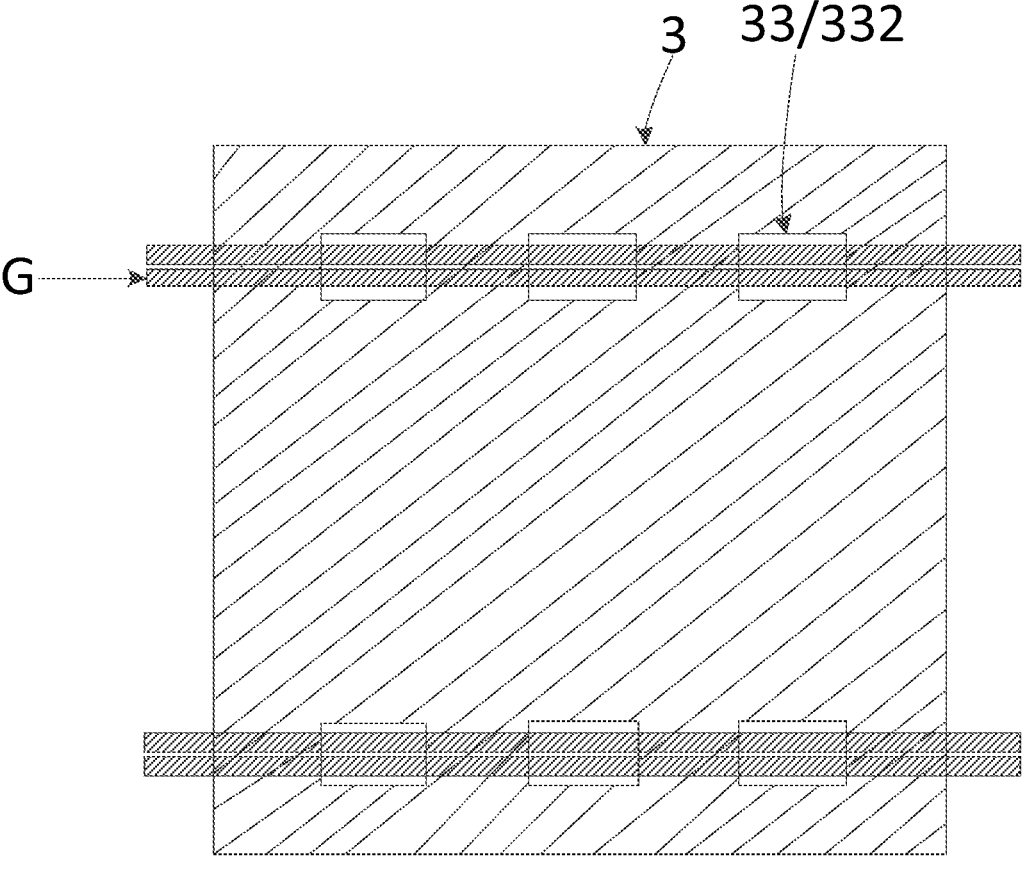

As shown in FIG. 6 and FIG. 7, FIG. 6 is a schematic diagram of non-detection areas BB located above and below the detection area AA in FIG. 5, and FIG. 7 is a schematic diagram of non-detection areas BB located on a left side and on a right side of the detection area AA in FIG. 5. The bias voltage layer 3 further includes at least one third hollowed structure 33, the third hollowed structure 33 is located in the non-detection area BB, and an orthographic projection of the third hollowed structure 33 on the base substrate 1 overlaps a portion of at least one of the gate signal line G and the data signal line D extending into the non-detection area BB. In this way, an overlapping area between the bias voltage layer 3 and the gate signal line G and/or the data signal line D can be further reduced, and coupling of high and low level signals on the gate signal line G and/or the data signal line D to the reference voltage signal on the bias voltage layer 3 can be further reduced. As a result, noise of the Vbias signal on the bias voltage layer 3 caused by the high and low level jump of the signal can be further reduced, and the stability of the Vbias signal on the bias voltage layer 3 can further be improved.

In some embodiments, in the active pixel image sensor of the present disclosure as shown in FIG. 6, the third hollowed structure 33 includes a third hollowed sub-structure 331, and an orthographic projection of the third hollowed sub-structure 331 on the base substrate overlaps a portion of the gate signal line G extending into the non-detection area BB. As shown in FIG. 7, the third hollowed structure 33 further includes a fourth hollowed sub-structure 332, and an orthographic projection of the fourth hollowed sub-structure 332 on the base substrate overlaps a portion of the data signal line D extending into the non-detection area BB. In this way, by arranging on the bias voltage layer 3 a hollowed structure that overlaps the portions of the gate signal line G and the data signal line D extending into the non-detection area BB, the coupling of high and low level signals on the gate signal line G and the data signal line D to the reference voltage signal on the bias voltage layer 3 can be further reduced, and the noise on the bias voltage layer 3 can be further reduced.

In some embodiments, in the active pixel image sensor of the present disclosure as shown in FIG. 6, a plurality of third hollowed sub-structures 331 are uniformly arranged in an extension direction of the gate signal line and overlap one of the plurality of gate signal lines G. In this way, a plurality of uniformly arranged third hollowed sub-structures 331 are arranged at a portion of each gate signal line G extending into the non-detection area BB, such that the overlapping area between the bias voltage layer 3 and the gate signal line G can be further reduced. As shown in FIG. 7, a plurality of fourth hollowed sub-structures 332 are uniformly arranged in an extension direction of the data signal line D and overlap one of the plurality of data signal lines D. In this way, a plurality of uniformly arranged fourth hollowed sub-structures 332 are arranged at a portion of each data signal line D extending into the non-detection area BB, such that the overlapping area between the bias voltage layer 3 and the data signal line D can be further reduced.

In some embodiments, in the active pixel image sensor of the present disclosure as shown in FIG. 6, a distance at A means a design margin distance between the data signal line D and the bias voltage layer 3, and the distance at A ranges from 0.3 μm to 2.0 μm. A distance at B means a line width of the bias voltage layer 3 between two adjacent third hollowed sub-structures 331. In order to ensure a minimum line width of B, design margin after CD bias is considered, coupling capacitance at an overlapping position can be minimized, and the distance at B ranges from 1.0 μm to 5.0 μm.

Figure 8:
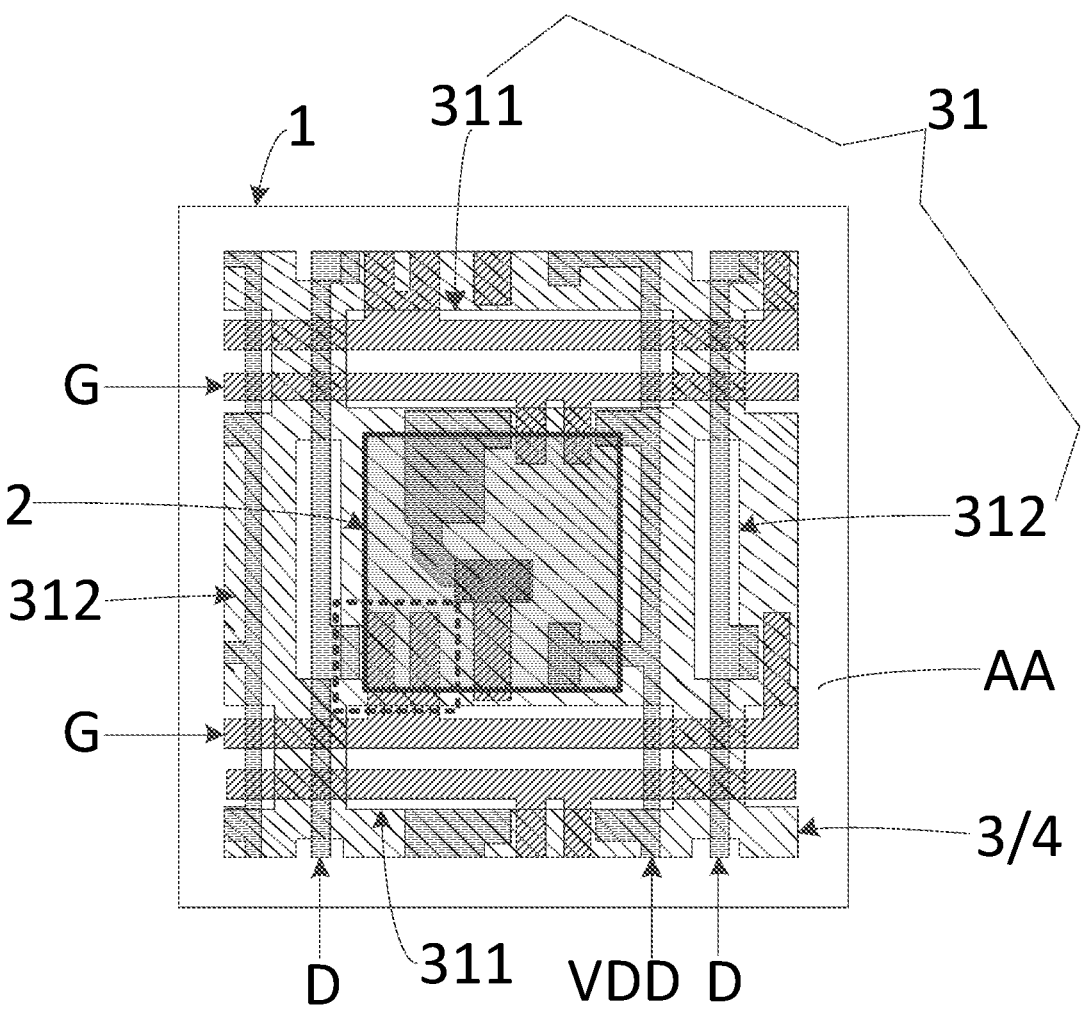

In some embodiments, the active pixel sensor of the present disclosure may be applied to fingerprint identification. A fingerprint identification sensor basically needs GND signals on an entire surface to shield static electricity caused by a finger touch, and the static electricity will cause electrostatic breakdown of the devices and cause irreversible damage to the devices. As a result, as shown in FIG. 8, the active pixel image sensor of the present disclosure further includes a first shield layer 4 on a side of the bias voltage layer 3 facing away from the base substrate 1, the first shield layer 4 is electrically connected with a first ground signal terminal (not shown in FIG. 8), and a shape of the first shield layer 4 is substantially same as a shape of the bias voltage layer 3. In some embodiments, the first shield layer 4 plays a role of shielding finger static electricity. Since the first shield layer 4 has the same hollowed structure pattern as the bias voltage layer 3, a coupling capacitance between the first shield layer 4 and other conductive layers can be reduced, and stability of a ground signal on the first shield layer 4 can be improved accordingly.

It should be noted that, as shown in FIG. 8, the shape of the first shield layer 4 is substantially same as the shape of the bias voltage layer 3, such that a film structure of the first shield layer 4 is not shown in FIG. 8, but a pattern of the bias voltage layer 3 is used to denote a pattern of the first shield layer 4.

Figure 9:
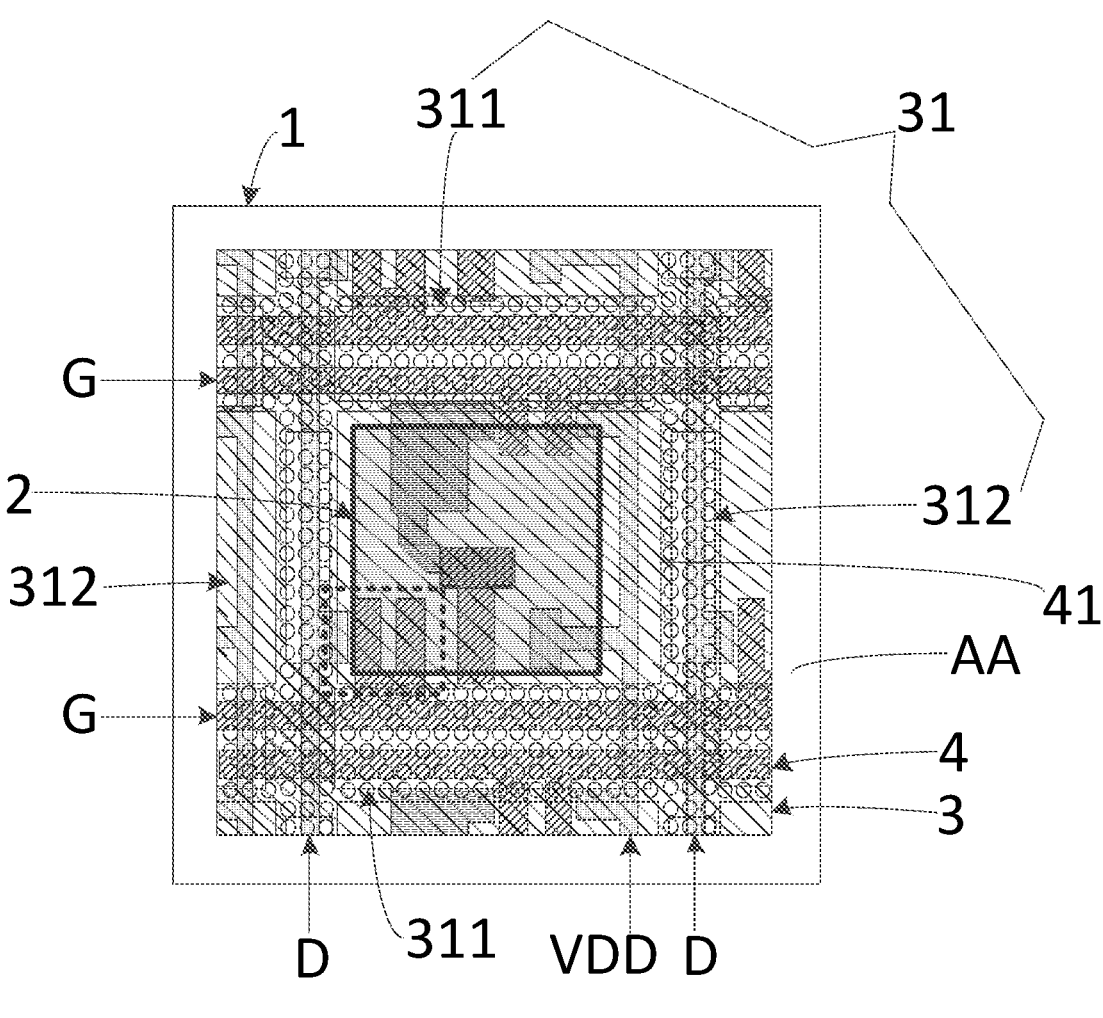

In some embodiments, as shown in FIG. 9, the active pixel image sensor of the present disclosure further includes: a first shield layer 4 (a film layer with small circles) on a side of the bias voltage layer 3 facing away from the base substrate 1. The first shield layer 4 is electrically connected with a first ground signal terminal (not shown in FIG. 9), the first shield layer 4 is a grid structure, a grid hole 41 of the grid structure corresponds to the photoelectric conversion structure 2, and an area of an orthographic projection of the grid hole 41 of the grid structure on the base substrate 1 is greater than or equal to an area of the orthographic projection of the photoelectric conversion structure 2 on the base substrate 1. In this way, the first shield layer 4 not only plays a role of shielding finger static electricity and reducing the coupling between the first shield layer 4 and other conductive layers, but also can improve a transmittance of optical signals compared with a transmittance of the structure shown in FIG. 8.

In some embodiments, the bias voltage layer of the present disclosure may be, but is not limited to, a transparent metal layer such as indium tin oxide (ITO) layer, or a light shielding metal layer such as Al and Mo layer. The first shield layer can be, but is not limited to, a transparent metal electrode such as ITO layer.

In some embodiments, in the active pixel image sensor of the present disclosure, as shown in FIG. 9, orthographic projections of the plurality of gate signal lines G and the plurality of data signal lines D on the base substrate 1 may fall within a range of orthographic projections of grid lines defining grid holes 41 on the base substrate 1.

Based on the same inventive concept, an embodiment of the present disclosure further provides a display device. The display device includes the active pixel image sensor provided in the present disclosure. Since a principle of solving problems of the display device is similar to that of the aforementioned active pixel image sensor, reference may be made to implementation of the active pixel image sensor for implementation of the aforementioned display device, and any repeated content will not be described again herein.

Figure 10:
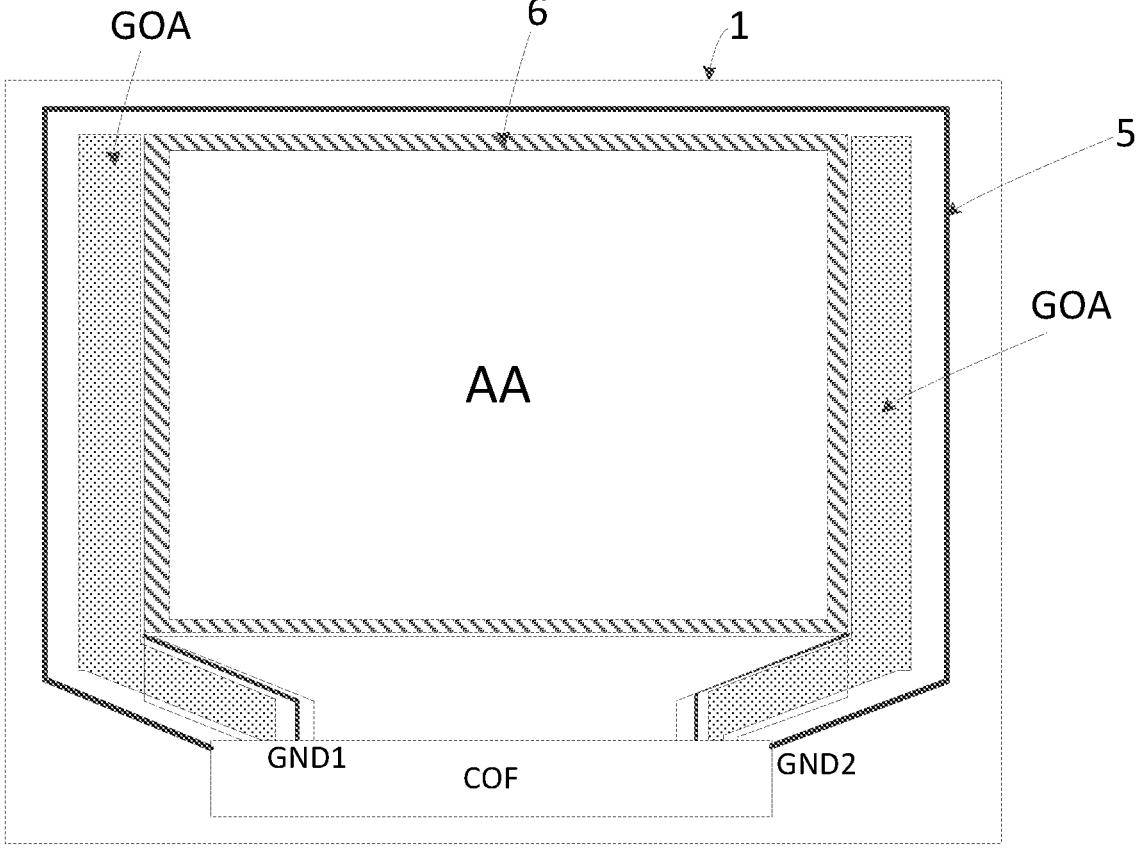
FIG. 10 is a schematic structural diagram of a display device according to an embodiment of the present disclosure.

In some embodiments, as shown in FIG. 10, FIG. 10 is a schematic diagram of peripheral signal connections of the display device, the display device of the present disclosure further includes a second shield layer 5 arranged around the active pixel image sensor. The second shield layer 5 is electrically connected with a second ground signal terminal GND2, and the first shield layer 4 is electrically connected with the first ground signal terminal GND1. In some embodiments, a gate drive circuit (GOA) is electrically connected with a chip on film (COF), and is configured to input a square wave signal into a gate signal line G described above. A first shield layer 4 of a detection area AA described above is connected with the first ground signal terminal GND1 on the COF through a GND ring 6, and a second shield layer 5 is arranged around the active pixel image sensor by one circle to be connected with the second ground signal terminal GND2 on the COF. Signals of the first grounding signal terminal GND1 and the second grounding signal terminal GND2 are not electrically connected on the COF, such that while shielding of finger static electricity is achieved, the risk that electrostatic discharge (ESD) is introduced into the detection area AA in processes of technology, back-end manufacturing and transportation is avoided. Specifically, this solution is not only suitable for the GOA solution, but also suitable for the Gate COF solution. This solution is not only suitable for the COF solution, but also suitable for the COG solution.

To sum up, the display device according to the embodiments of the present disclosure can improve stability of a signal on a bias voltage layer Vbias, reduce signal coupling and noise, and avoid the risk of introducing peripheral GND static electricity while improving an electrostatic shielding ability of the first shield layer.

The display device has features of a high contrast, a desirable brightness and high color reproduction. The display device may be a rigid display device or a flexible display device (that is, flexible and foldable). The display device may be any product or component with a display function, such as a mobile phone, a tablet computer, a television, a display, a notebook computer, a digital photo frame and a navigator. Other essential components of the display device shall be understood as necessary by those of ordinary skill in the art, are not repeated herein, and should not be regarded as limitation to the present disclosure.

According to the active pixel image sensor and the display device provided by the embodiments of the present disclosure, the bias voltage layer is provided with at least one first hollowed structure, and the orthographic projection of the first hollowed structure on the base substrate overlaps the orthographic projection of at least one of the gate signal line and the data signal line on the base substrate. In this way, an overlapping area between the bias voltage layer and the gate signal line and/or the data signal line can be reduced, and coupling of a square wave signal on the gate signal line and/or the data signal line to the bias voltage layer can be reduced. As a result, noise of the Vbias signal on the bias voltage layer caused by a high and low level jump of the signal can be further reduced, and the stability of the Vbias signal on the bias voltage layer can be further be improved.

Apparently, those skilled in the art can make various modifications and variations to the present disclosure without departing from the spirit and scope of the present disclosure. Thus, the present disclosure is intended to encompass such modifications and variations which fall within the scope of the appended claims of the present disclosure and their equivalents as well.

What is claimed is:

1. An active pixel image sensor, comprising:
a base substrate;
a photoelectric conversion structure arranged on the base substrate;
a plurality of gate signal lines and a plurality of data signal lines that are crossed in an insulated manner, wherein the plurality of gate signal lines and the plurality of data signal lines are configured to provide an electrical signal for the photoelectric conversion structure; and
a bias voltage layer, wherein the bias voltage layer is arranged on the photoelectric conversion structure and electrically connected with the photoelectric conversion structure, and the bias voltage layer is configured to provide a bias voltage for the photoelectric conversion structure; wherein
the bias voltage layer comprises at least one first hollowed structure, and an orthographic projection of the first hollowed structure on the base substrate overlaps an orthographic projection of at least one of the gate signal line and the data signal line on the base substrate;
wherein the orthographic projection of the first hollowed structure on the base substrate does not overlap with an orthographic projection of an intersection position between the gate signal line and the data signal line on the base substrate;
the first hollowed structure comprises a first hollowed sub-structure and a second hollowed sub-structure, an orthographic projection of the first hollowed sub-structure on the base substrate overlaps an orthographic projection of the gate signal line on the base substrate, and an orthographic projection of the second hollowed sub-structure on the base substrate overlaps an orthographic projection of the data signal line on the base substrate.

2. The active pixel image sensor according to claim 1, wherein the base substrate comprises a detection area, and the plurality of gate signal lines and the plurality of data signal lines define a plurality of detection units in the detection area; and
one photoelectric conversion structure is arranged in each of the plurality of detection units, and two first hollowed sub-structures and two second hollowed sub-structures are arranged around one photoelectric conversion structure.

3. The active pixel image sensor according to claim 2, wherein a width of the orthographic projection of the first hollowed sub-structure on the base substrate is greater than a width of the orthographic projection of the gate signal line on the base substrate; and
a width of the orthographic projection of the second hollowed sub-structure on the base substrate is greater than a width of the orthographic projection of the data signal line on the base substrate.

4. The active pixel image sensor according to claim 1, further comprising a power signal line that is arranged on a same layer as the data signal line and is adjacent to the data signal line, wherein an orthographic projection of the power signal line on the base substrate is located between the orthographic projection of the data signal line on the base substrate and an orthographic projection of the photoelectric conversion structure on the base substrate;

12 the orthographic projection of the first hollowed sub-structure on the base substrate further covers the orthographic projection of the power signal line on the base substrate; and
the orthographic projection of the second hollowed sub-structure on the base substrate further covers the orthographic projection of the power signal line on the base substrate.

5. The active pixel image sensor according to claim 1, wherein the bias voltage layer further comprises at least one second hollowed structure;
an orthographic projection of the second hollowed structure on the base substrate overlaps an orthographic projection of the photoelectric conversion structure on the base substrate;
the second hollowed structure and the first hollowed structure are arranged independently; and
the orthographic projection of the second hollowed structure on the base substrate is smaller than the orthographic projection of the photoelectric conversion structure on the base substrate.

6. The active pixel image sensor according to claim 5, wherein a center of the orthographic projection of the second hollowed structure on the base substrate coincides with a center of the orthographic projection of the photoelectric conversion structure on the base substrate.

7. The active pixel image sensor according to claim 1, wherein the base substrate comprises a detection area and a non-detection area around the detection area; and
the bias voltage layer further comprises at least one third hollowed structure, the third hollowed structure is located in the non-detection area, and an orthographic projection of the third hollowed structure on the base substrate overlaps a portion of at least one of the gate signal line and the data signal line extending into the non-detection area.

8. The active pixel image sensor according to claim 7, wherein the third hollowed structure comprises a third hollowed sub-structure and a fourth hollowed sub-structure;
an orthographic projection of the third hollowed sub-structure on the base substrate overlaps a portion of the gate signal line extending into the non-detection area; and
an orthographic projection of the fourth hollowed sub-structure on the base substrate overlaps a portion of the data signal line extending into the non-detection area.

9. The active pixel image sensor according to claim 8, wherein a plurality of third hollowed sub-structures are uniformly arranged in an extension direction of the gate signal line and overlap one of the plurality of gate signal lines; and
a plurality of fourth hollowed sub-structures are uniformly arranged in an extension direction of the data signal line and overlap one of the plurality of data signal lines.

10. The active pixel image sensor according to claim 1, further comprising a first shield layer on a side of the bias voltage layer facing away from the base substrate;
wherein the first shield layer is electrically connected with a first ground signal terminal, and a shape of the first shield layer is substantially same as a shape of the bias voltage layer.

11. The active pixel image sensor according to claim 1, further comprising a first shield layer on a side of the bias voltage layer facing away from the base substrate;

wherein the first shield layer is electrically connected with a first ground signal terminal;

the first shield layer is a grid structure, a grid hole of the grid structure corresponds to the photoelectric conversion structure; and an area of an orthographic projection of the grid hole of the grid structure on the base substrate is greater than or equal to an area of an orthographic projection of the photoelectric conversion structure on the base substrate.

12. The active pixel image sensor according to claim 11, wherein orthographic projections of the plurality of gate signal lines and the plurality of data signal lines on the base substrate fall within a range of orthographic projections of grid lines defining grid holes on the base substrate.

13. A display device, comprising the active pixel image sensor according to claim 1.

14. The display device according to claim 13, further comprising a second shield layer arranged around the active pixel image sensor, wherein the second shield layer is electrically connected with a second ground signal terminal.

15. The display device according to claim 13, wherein the base substrate comprises a detection area, and the plurality of gate signal lines and the plurality of data signal lines define a plurality of detection units in the detection area; and one photoelectric conversion structure is arranged in each of the plurality of detection units, and two first hollowed sub-structures and two second hollowed sub-structures are arranged around one photoelectric conversion structure.

16. The display device according to claim 15, wherein a width of the orthographic projection of the first hollowed sub-structure on the base substrate is greater than a width of the orthographic projection of the gate signal line on the base substrate; and a width of the orthographic projection of the second hollowed sub-structure on the base substrate is greater than a width of the orthographic projection of the data signal line on the base substrate.

\* \* \* \* \*